(12) United States Patent  
Yoshihara et al.

(10) Patent No.: US 7,906,173 B2  
(45) Date of Patent: Mar. 15, 2011

(54) RESIST COATING METHOD AND RESIST COATING APPARATUS

(75) Inventors: Kousuke Yoshihara, Koshi (JP); Tomohiro Iseki, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 970 days.

(21) Appl. No.: 11/549,826

(22) Filed: Oct. 16, 2006

(65) Prior Publication Data

US 2007/0092643 A1    Apr. 26, 2007

(30) Foreign Application Priority Data

Oct. 20, 2005   (JP) .................................. 2005-305999

(51) Int. Cl.  
    *B05D 3/12*    (2006.01)
(52) U.S. Cl. .......... 427/240; 427/425; 118/52; 118/320; 438/758
(58) Field of Classification Search .................. 427/240, 427/425; 118/52, 320; 438/758  
See application file for complete search history.

(56) References Cited

U.S. PATENT DOCUMENTS 6,117,486 A  *  9/2000  Yoshihara ..................... 427/240  
2004/0076749 A1 *  4/2004  Lee et al. ..................... 427/240

FOREIGN PATENT DOCUMENTS

| JP | 10-151406 | 6/1998 |
| JP | 11-16810  | 1/1999 |
| JP | 11-260717 | 9/1999 |
| JP | 3330324   | 7/2002 |

* cited by examiner

*Primary Examiner* — Kirsten C Jolley  
(74) *Attorney, Agent, or Firm* — Oblon, Spivak, McClelland, Maier & Neustadt, L.L.P.

(57) ABSTRACT

A resist coating method supplies a resist solution to substantially the center of a target substrate to be processed while rotating the target substrate at a first rotational speed, then reduces a rotational speed of the target substrate to a second rotational speed lower than the first rotational speed, reduces the rotational speed of the target substrate to a third rotational speed lower than the second rotational speed or until rotational halt to adjust the film thickness of the resist solution, and accelerates the rotation of the target substrate to a fourth rotational speed higher than the third rotational speed to spin off a residue of the resist solution.

12 Claims, 6 Drawing Sheets

RESIST COATING METHOD AND RESIST COATING APPARATUS

BACKGROUND OF THE INVENTION

1. Field of the Invention

The present invention relates to a resist coating method and a resist coating apparatus which apply or coat a resist solution to a substrate to be processed like a semiconductor wafer.

2. Description of the Related Art

A photolithographic process step in a semiconductor device manufacturing process includes, for example, a resist coating step for forming a resist film on a semiconductor wafer and a developing step for developing a resist-coated wafer after an exposure process is performed on the resist-coated wafer. A spin coating method is widely used in the resist coating step to coat a resist solution uniformly over the wafer surface.

According to the spin coating method, a semiconductor wafer is rotated together with a spin chuck by rotational drive means with the semiconductor wafer vacuum-fixed on the spin chuck, and a resist nozzle positioned above the semiconductor wafer drops a resist solution onto the center of the wafer surface. The dropped resist solution spreads radially outward toward the circumference of the semiconductor wafer by centrifugal force. Although the dropping of the resist solution is terminated thereafter, the semiconductor wafer is continuously rotated while decreasing the rotational speed to spin off and dry the resist solution spread over the wafer surface.

Recently, reduction of resist consumption, i.e., reduction of the amount of the resist solution dropped on a wafer is strongly desired from the viewpoint of reducing the manufacturing cost or the like. When the amount of the resist solution dropped on a wafer is relatively large, the thickness of a coated film is easily adjustable to ensure a uniform thickness. When the amount of the resist solution dropped on the wafer is reduced, however, even if the conventional spin coating method can coat the resist solution to the entire wafer surface, the adjustment of the thickness of a coated film is difficult, making it difficult to achieve the uniform thickness. Specifically, with a small amount of the resist solution dropped on the wafer, as drying the resist solution rapidly progresses before the dropped resist solution sufficiently spreads toward the circumference of the wafer, raising a problem on the distribution of the thicknesses of the coated film such that the thickness of the outer circumference portion of the wafer is thinner than that of the central portion thereof. Accordingly, adjustment of the thickness is difficult, making it difficult for the coated film to have a uniform predetermined thickness.

As a method of adjusting the thickness of a coated film uniformly even with a reduced amount of a resist solution dropped, Japanese Patent Laid-open Publication No. H11-260717 discloses a resist coating method that includes a step of applying (coating) a resist solution to a target substrate to be processed while spreading the resist solution radially outward toward the circumference of the target substrate by supplying the resist solution to the approximate center of the target substrate while rotating the target substrate at a first rotational speed, a step of adjusting the thickness of the coated film by reducing the rotational speed of the target substrate to a second rotational speed lower than the first rotational speed after supply of the resist film is terminated, and a step of spinning off a residue of the resist solution by accelerating the rotational speed of the target substrate to a third rotational speed higher than the second rotational speed.

The method disclosed in the publication is excellent in that the thickness of the resist film can be made uniform over the entire target substrate even if the supply amount of the resist solution is significantly reduced. Recently, reduction in the supply amount of the resist solution is demanded more than ever, and there is a demand to reduce the supply amount of the resist solution by even a tiny amount of $\frac{1}{10}$ ml. However, because the method disclosed in Japanese Patent Laid-open Publication No. H11-260717 rapidly decelerates the rotation of the target substrate from the first rotational speed to the second rotational speed, a deceleration shock causes the resist solution that is spreading around the wafer surface to return from the outer circumference of the wafer toward the center thereof. This increases the supply amount of the resist solution even slightly (for example, 0.1 ml or so). That is, the method disclosed in the publication allows the excess resist solution to realize the uniformity of the thickness of the coated film even if the amount of the excess resist is minimal. From the standpoint of reducing the supply amount of the resist solution, there still is a room for improvement.

BRIEF SUMMARY OF THE INVENTION

It is an object of the invention to provide a resist coating method and a resist coating apparatus which can reduce the supply amount of a resist solution as much as possible while making the thickness of a coated film uniform.

According to the first aspect of the invention, there is provided a resist coating method comprising:

supplying a resist solution to substantially a center of a target substrate to be processed while rotating said target substrate at a first rotational speed;

reducing a rotational speed of said target substrate to a second rotational speed lower than said first rotational speed after supply of said resist solution is terminated;

reducing said rotational speed of said target substrate to a third rotational speed lower than said second rotational speed or until rotational halt to adjust a film thickness of said resist solution; and accelerating said rotation of said target substrate to a fourth rotational speed higher than said third rotational speed to spin off a residue of said resist solution.

According to the second aspect of the invention, there is provided a resist coating apparatus which supplies and coats a resist solution onto a rotating target substrate to be processed, comprising:

a substrate holding member which holds said target substrate;

rotation means which rotates said substrate holding member at a variable speed;

a resist solution nozzle which supplies said resist solution to substantially a center of said target substrate held by said substrate holding member; and control means which controls to start supplying said resist solution while rotating said substrate holding member holding said target substrate at a first rotational speed, reduce a rotational speed of said target substrate to a second rotational speed lower than said first rotational speed after supply of said resist solution is terminated, reduce said rotational speed of said target substrate to a third rotational speed lower than said second rotational speed or until rotational halt, and then accelerate said rotation of said target substrate to a fourth rotational speed higher than said third rotational speed to spin off a residue of said resist solution.

According to the third aspect of the invention, there is provided a computer-readable storage medium storing a control program that, when executed, works a computer to control a resist coating apparatus using a resist coating method, the method comprising:

supplying a resist solution to substantially a center of a target substrate to be processed while rotating said target substrate at a first rotational speed;

reducing a rotational speed of said target substrate to a second rotational speed lower than said first rotational speed after supply of said resist solution is terminated;

reducing said rotational speed of said target substrate to a third rotational speed lower than said second rotational speed or until rotational halt to adjust a film thickness of said resist solution; and accelerating said rotation of said target substrate to a fourth rotational speed higher than said third rotational speed to spin off a residue of said resist solution.

DETAILED DESCRIPTION OF THE INVENTION

Figure 1:
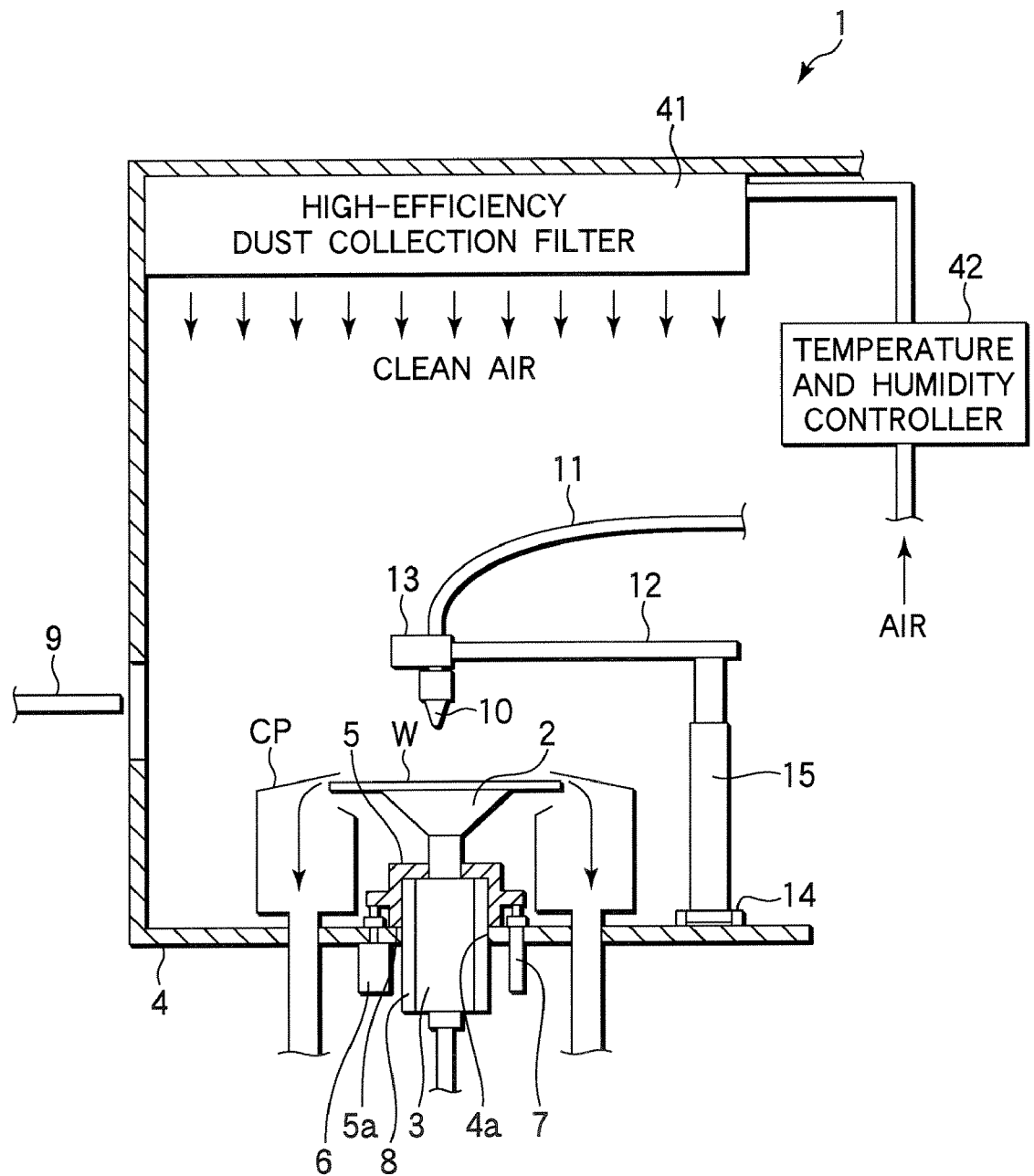
FIG. 1 is a cross-sectional view showing the general structure of a resist coating apparatus.
Figure 2:
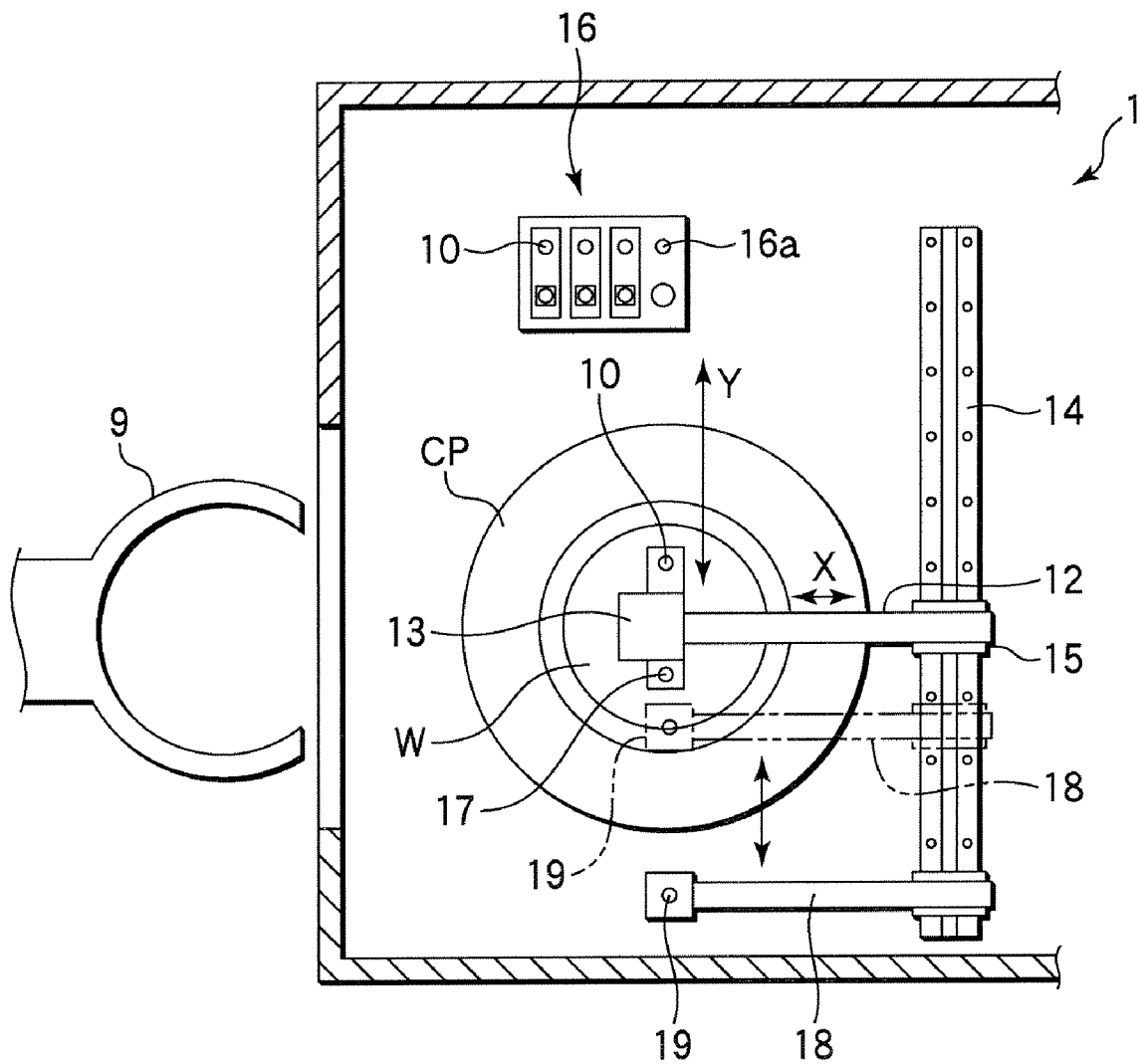
FIG. 2 is a top plan view of the resist coating apparatus shown in FIG. 1.

A preferred embodiment of the invention will be explained with reference to the accompanying drawings. FIGS. 1 and 2 are cross-sectional view and a top plan view showing the general structure of a resist coating unit (COT) 1 according to one embodiment of the invention. A circular cup CP is disposed at the center of the resist coating unit (COT) 1. A spin chuck 2 is disposed within the cup CP. The spin chuck 2 is rotated by a drive motor 3 with a semiconductor wafer (hereinafter, referred to as "wafer") W vacuum-adsorbed on the spin chuck 2. The drive motor 3 is disposed in an opening 4a provided in a unit bottom plate 4 in an elevatable manner, and is coupled to an up-and-down drive unit 6 comprising, for example, an air cylinder, and an up-and-down guide unit 7 through a cap-form flange member 5 made of, for example, aluminum. A cylindrical cooling jacket 8 made of, for example, stainless steel (SUS) is attached to the side face of the motor 3. The flange member 5 is attached so as to cover the upper half portion of the cooling jacket 8.

In applying a resist solution, a bottom end 5a of the flange member 5 come in close contact with the unit bottom plate 4 in the vicinity of the outer circumference of the opening 4a, thereby tightly sealing the interior of the unit. When the wafer W is delivered between the spin chuck 2 and a holding member 9 of a wafer transfer mechanism (not shown), the up-and-down drive unit 6 lifts the drive motor 3 or the spin chuck 2 upwards, so that the bottom end 5a of the flange member 5 comes upwards from the unit bottom plate 4.

A resist nozzle 10 for supplying a resist solution to the surface of the wafer W is connected to a resist supplier (to be discussed later) through a resist feed pipe 11. The resist nozzle 10 is removably attached to the leading end of a resist nozzle scan arm 12 through a nozzle holder 13. The resist nozzle scan arm 12 is mounted at the upper end portion of a vertical support member 15 horizontally movable on a guide rail 14 provided on the unit bottom plate 4 in one direction (Y direction). The resist nozzle scan arm 12 therefore moves in the Y direction together with the vertical support member 15 by a Y-direction drive mechanism (not shown).

To selectively mount the resist nozzle 10 at a resist nozzle standby unit 16, the resist nozzle scan arm 12 is also movable in an X direction orthogonal to the Y direction by an X-direction drive mechanism (not shown).

The discharge outlet of the resist nozzle 10 is inserted into an opening 16a of a solvent atmosphere chamber at the resist nozzle standby unit 16, and exposed to the solvent atmosphere, thereby preventing the resist solution at the leading end of the nozzle from being solidified or deteriorated. A plurality of resist nozzles 10 are provided, and used individually according to the kinds of resist solutions in use.

A solvent nozzle 17, which supplies a solvent like a thinner for wetting the wafer surface prior to supply of the resist solution to the wafer surface, is mounted at the leading end of the resist nozzle scan arm 12 (nozzle holder 13). The solvent nozzle 17 is connected to a solvent supplier (to be discussed later) through a solvent feed pipe (not shown). The solvent nozzle 17 and the resist nozzle 10 are mounted in such a way that the respective discharge outlets thereof are positioned in line along the Y direction of the resist nozzle scan arm 12.

In addition to the vertical support member 15 that supports the resist nozzle scan arm 12, a vertical support member (not shown) that supports a rinse nozzle scan arm 18 and is movable in the Y direction is provided on the guide rail 14. A rinse nozzle 19 for a side rinse is mounted at the leading end of the rinse nozzle scan arm 18. The Y-direction drive mechanism (not shown) causes the rinse nozzle scan arm 18 and the rinse nozzle 19 to move in parallel or in line between a rinse nozzle standby position (indicated by a solid line) set sideward of the cup CP and a rinse solution discharge position (indicated by a double dashed line) set directly above the circumference of the wafer W mounted on the spin chuck 2.

A high-efficiency dust collection filter 41 is provided above the wafer W. Air whose temperature and humidity are adjusted by a temperature and humidity controller 42 passes through the high-efficiency dust collection filter 41 to remove dust, so that clean air is supplied into the resist coating unit (COT) 1. Note that a gas containing, for example, a solvent for the resist solution may be introduced instead of air.

Figure 3:
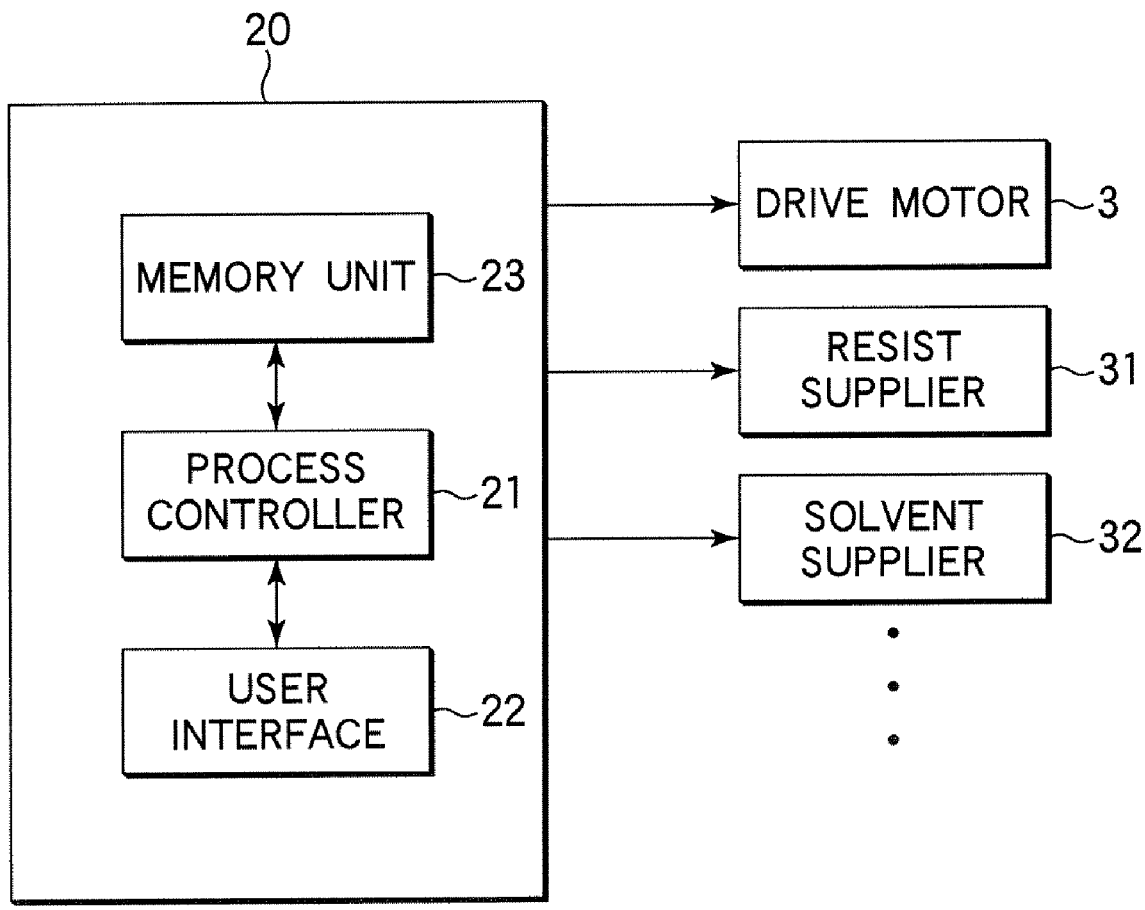
FIG. 3 is a diagram showing the structure of a control system of the resist coating apparatus shown in FIG. 1.

FIG. 3 is a diagram showing the structure of a control system of the resist coating unit (COT) 1. Individual structural portions of the resist coating unit (COT) 1 are connected to a controller 20 to be controlled by the controller 20.

The controller 20 has a process controller 21 that includes a CPU, a user interface 22, and a memory unit 23. The user interface 22 is connected to the process controller 21, and comprises a keyboard for allowing a process manager to perform a command input operation or the like to control the resist coating unit (COT) 1, a display that indicates the visualized operation status of the resist coating unit (COT) 1. The memory unit 23, connected to the process controller 21, stores a control program (software) for realizing various processes to be executed by the resist coating unit (COT) 1 under the control of the process controller 21, and recipes recording plural pieces of process condition data or the like.

As an arbitrary recipe is called up by an instruction or the like input through the user interface 22 as needed, and executed by the process controller 21, the resist coating unit (COT) 1 executes a desired process under the control of the process controller 21. The controller 20 controls, for example, driving of the drive motor 3, a resist supplier 31, and a solvent supplier 32. Specifically, the controller 20 controls the drive motor 3 so as to gradually decrease the rotational speed thereof. The controller 20 also controls a timing of supplying the resist solution from the resist supplier 31 to the resist nozzle 10, a timing of supplying a solvent like a thinner from the solvent supplier 32 to the solvent nozzle 17, and the amounts of the resist solution and the solvent to be supplied.

The control program and recipes for the process condition data can be those stored in a computer-readable memory medium, such as a CD-ROM, a hard disk, a flexible disk or a flash memory, or can be transmitted online from another apparatus via an exclusive line for use as needed.

Next, an explanation will be given of a resist coating operation of the thus structured resist coating unit (COT) 1.

As a wafer W is transferred to above the cup CP in the resist coating unit (COT) 1 by the holding member 9 of the wafer transfer mechanism (not shown), the wafer W is vacuum-adsorbed on the spin chuck 2 lifted upwards by the up-and-down drive unit 6 comprising, for example, an air cylinder, and the up-and-down guide unit 7. After vacuum-adsorbing the wafer W on the spin chuck 2, the wafer transfer mechanism moves the holding member 9 backwards from the interior of the resist coating unit (COT) 1 to terminate the transfer of the wafer W to the resist coating unit (COT) 1.

Next, the spin chuck 2 is lifted downwards until the wafer W comes to a home position in the cup CP. Subsequently, the drive motor 3 starts rotating the spin chuck 2. Thereafter, the nozzle holder 13 starts moving from the resist nozzle standby unit 16. The nozzle holder 13 moves along the Y direction.

When the discharge outlet of the solvent nozzle 17 reaches above the center of the spin chuck 2 (the center of the wafer W), the solvent like a thinner is supplied to the surface of the rotating wafer W. The solvent supplied to the wafer surface uniformly spreads from the center of the wafer W to the entire periphery thereof by centrifugal force.

Next, the nozzle holder 13 moves in the Y direction until the discharge outlet of the resist nozzle 10 reaches above the center of the spin chuck 2 (the center of the wafer W). The resist solution is dropped from the discharge outlet of the resist nozzle 10 to the center of the rotating wafer W to be coated onto the wafer surface.

Figure 4:
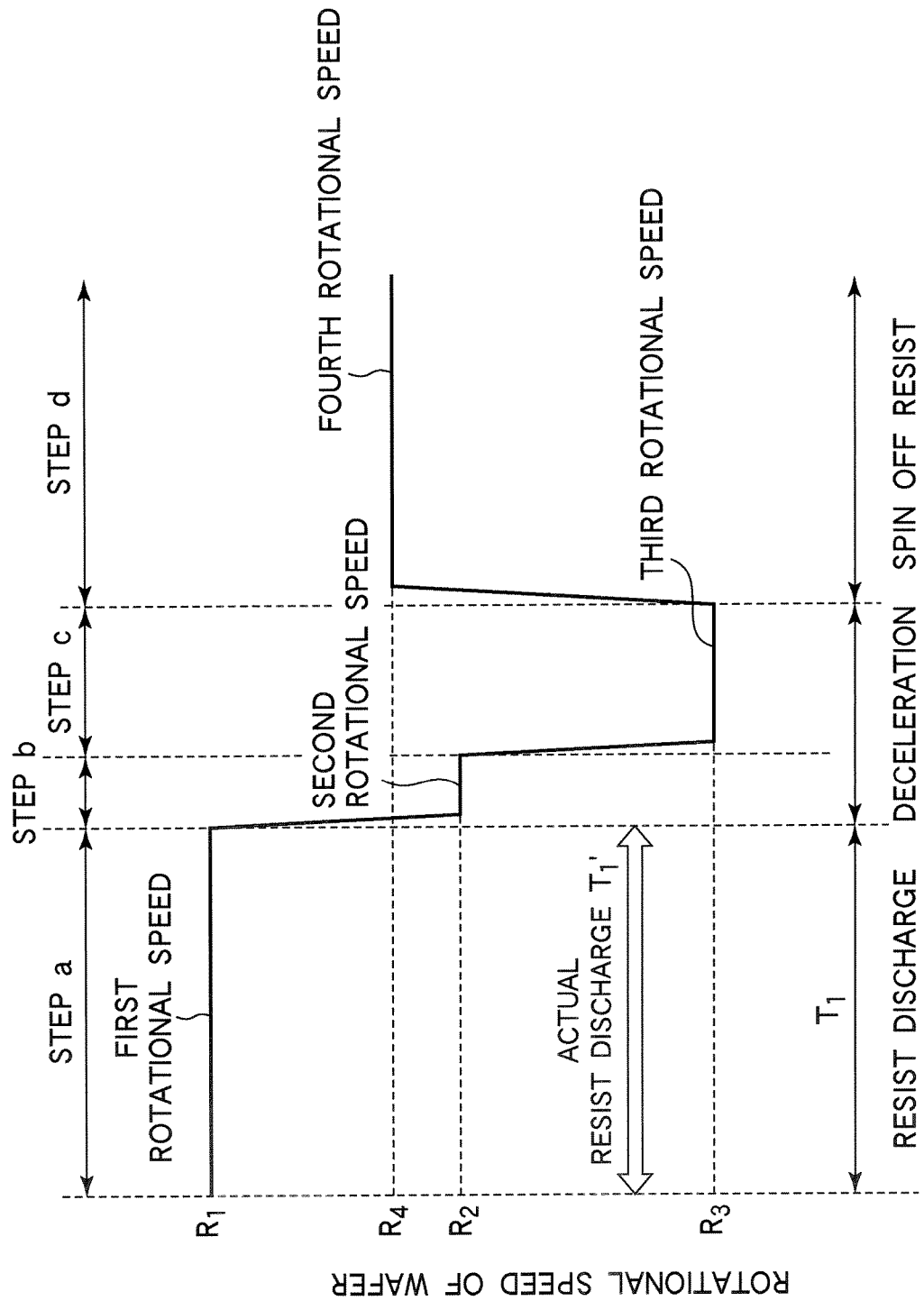
FIG. 4 is a timing chart showing the states of rotational control by the resist coating apparatus shown in FIG. 1.

In the embodiment, the rotational speed of the wafer W (i.e., the number of rotations of the drive motor 3) is controlled by the controller 20, and as shown in, for example, a timing chart in FIG. 4, the following steps a to c are executed.

Step a:

The resist solution is coated onto the wafer W by dropping the resist solution on the approximate center of the wafer W from the resist nozzle 10 and spreading the resist solution on the wafer W radially outward toward the circumference of the wafer W while rotating the wafer W at a first rotational speed $R_1$. A time of discharging the resist solution in this step is set as $T_1$.

Step b:

After the dropping of the resist solution is finished, the rotational speed of the wafer W is reduced to a second rotational speed $R_2$ lower than the first rotational speed $R_1$, and keeps the state for a predetermined time.

Step c:

The rotational speed of the wafer W is further reduced to a third rotational speed $R_3$, and keeps the state for a given time.

Step d:

Thereafter, the rotational speed of the wafer W is increased to a fourth rotational speed $R_4$ higher than the third rotational speed $R_3$ to spin off the residue of the resist solution.

The step a is so-called dynamic coating which supplies the resist solution to near the center of the wafer W while rotating the wafer W. In the step a, as the resist is coated while the wafer W is rotated, it is possible to form a resist film uniformly on the surface of the wafer W with an extremely small resist amount.

In the step b, after the dropping of the resist solution is finished, the rotational speed of the wafer W is reduced to the second rotational speed $R_2$ lower than the first rotational speed $R_1$, and keeps the rotational speed for a given time to adjust the surface of the resist film. If the rotational speed is reduced from the first rotational speed $R_1$ to the lower third rotational speed $R_3$ at once, force acting toward the center of the wafer W is applied to the resist solution on the wafer W at the time of the deceleration. This makes it necessary to feed an excess resist solution, slightly though it is, so that consumption of the resist solution becomes larger by what corresponds to the amount of the excess resist solution. However, the multi-step deceleration process of reducing the rotational speed of the wafer W to the second rotational speed $R_2$ temporarily, and then further reducing the rotational speed to the third rotational speed $R_3$ therefrom eases the deceleration-oriented action of returning the resist solution on the wafer W to the center thereof, making it possible to save the supply amount of the resist solution.

In the step c, the rotational speed of the wafer W is reduced from the second rotational speed $R_2$ to the third rotational speed $R_3$ which is kept for a given time. As the rotational speed of the wafer W at the third rotational speed $R_3$ is low, drying of the resist solution is slow and the resist solution has fluidity, thus demonstrating the function of adjusting the film thickness. Therefore, it is possible to adjust the thickness of the resist film, in particular, at the circumference of the wafer W. In case where a small amount of a resist solution is applied, the film thickness is generally thinner at the circumference of the wafer W than at the center portion thereof. In this respect, the resist solution at the center portion of the wafer W can be spread toward the circumference thereof to adjust the film thickness distribution on the surface of the wafer W by slowly rotating the wafer W at the third rotational speed $R_3$ for a given time.

The third rotational speed $R_3$ may be a rotational halt state ($R_3$=0 rpm). In this case, the thickness of the film can be adjusted by controlling the airflow of clean air supplied via the high-efficiency dust collection filter 41 located above the wafer W. The gas supplied from the high-efficiency dust collection filter 41 is not limited to air, but may be a gas containing, for example, a solvent for the resist solution (for example, air and $N_2$ gas). This makes it possible to set a solvent atmosphere in the resist coating unit (COT) 1, so that the drying of the resist solution can be further delayed.

In the step d, the rotational speed of the wafer W is increased to the fourth rotational speed $R_4$ higher than the third rotational speed $R_3$ to spin off the excess of the resist solution.

According to the conventional spin coating method which spins off the residue of the resist solution while maintaining the rotational speed of the wafer W without deceleration after the dropping of the resist solution, when the amount of the resist solution dropped to the wafer W is reduced, the drying of the resist solution progresses fast before the dropped resist solution sufficiently spreads radially outward toward the circumference of the wafer W. Accordingly, the applied film has a thickness distribution such that the thickness of the film at the circumference of the wafer W is thinner than that of the film at the center of the wafer W, thus making it difficult to adjust the film thickness. If the rotational speed is reduced from the first rotational speed $R_1$ to the low third rotational speed $R_3$, which is low or a rotational halt state, at once as disclosed in, for example, Japanese Patent Laid-open Publication No. H11-260717, to avoid such difficulty, the deceleration at the time of reducing the rotational speed causes returning force toward the center of the wafer W to the resist solution on the wafer W, and suppresses the resist solution from spreading thinly. This requires that the supply amount of the resist solution should be increased by what corresponds to the suppression.

By way of contrast, according to the spin coating method of the embodiment, as described above, the returning of the resist solution toward the center of the wafer W is suppressed by performing the two-step deceleration of reducing the rotational speed of the wafer W to the second rotational speed $R_2$ temporarily during the coating process, and then reducing the rotational speed to the third rotational speed $R_3$ or stopping the rotation. Therefore, it is not necessary to set the supply amount of the resist solution excessively. Because the thickness of the resist film on the wafer W is adjusted at the third rotational speed $R_3$ which is low or in the rotational halt, the film at the circumference of the wafer W can have a sufficient thickness. Thus, the coated resist solution can stay on the circumference of the wafer W as well as at the center thereof, making it possible to spread a resist film having a predetermined uniform thickness over the entire wafer W. Therefore, it is possible to adjust the thicknesses of the coated films on wafers to a uniform predetermined thickness while reducing the amount of the resist solution dropped on each wafer W as much as possible. The spin coating method according to the embodiment which reduces the rotational speed in multiple steps can minimize the consumption amount of the resist solution, and is thus extremely useful.

Figure 5:
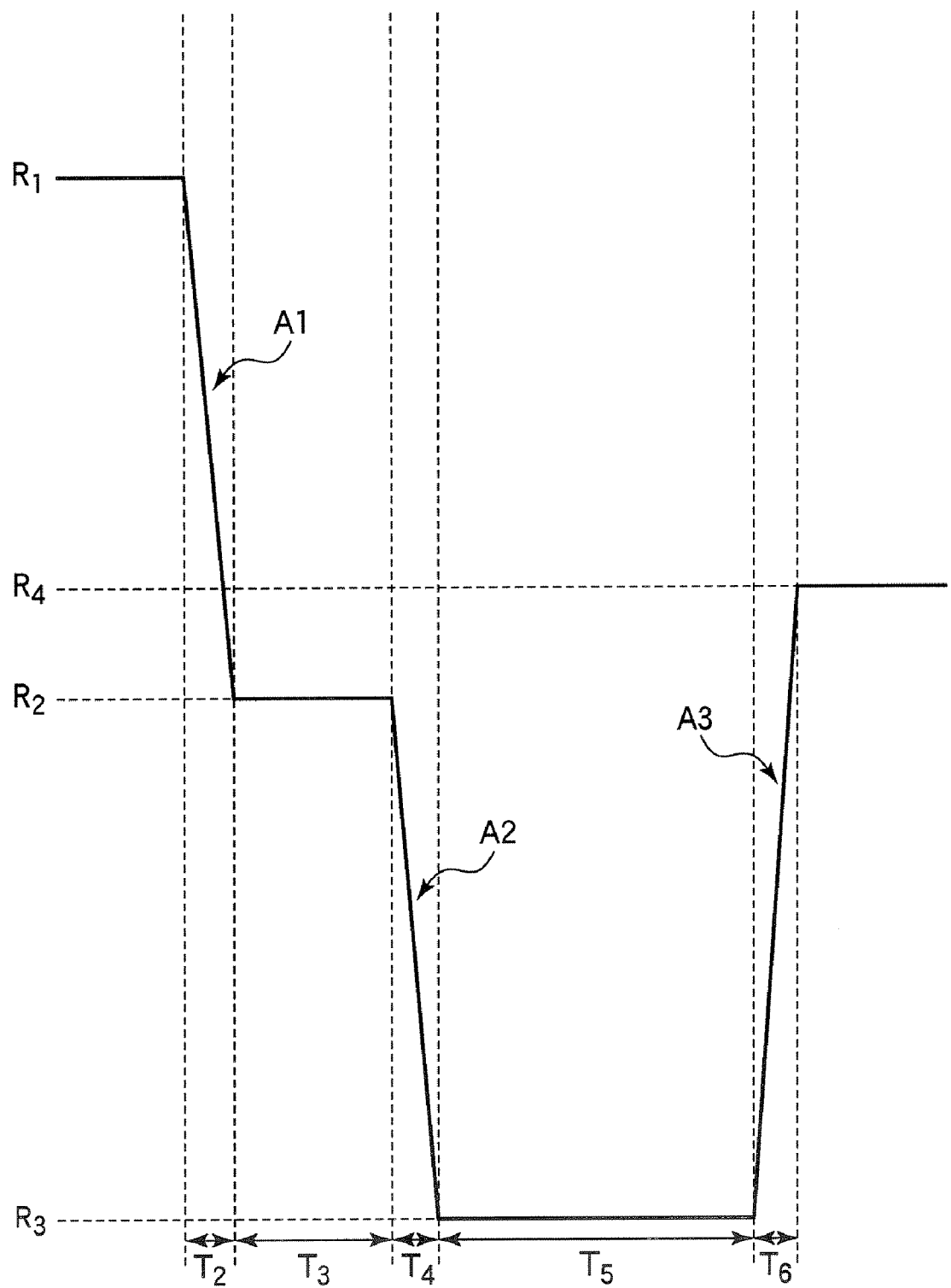
FIG. 5 is an enlarged view of the essential part of the timing chart of FIG. 4.

As shown in FIG. 5, let A1 be a deceleration in the deceleration step from the first rotational speed $R_1$ to the second rotational speed $R_2$, let $T_2$ be a time necessary for the deceleration step, let $T_3$ be a time for keeping the rotational speed at the second rotational speed $R_2$, let A2 be a deceleration in the deceleration step from the second rotational speed $R_2$ to the third rotational speed $R_3$, let $T_4$ be a time necessary for this deceleration step, let A3 be an acceleration when the rotational speed is increased from the third rotational speed $R_3$ to the fourth rotational speed $R_4$, and let $T_6$ be a time necessary for this acceleration.

While the first to fourth rotational speeds can be appropriately set according to the kind of the resist solution in use, presence/absence of a solvent pre-coat, the diameter of the wafer W, and so forth, it is preferable to set the rotational speed as follows.

The first rotational speed $R_1$ is set to such a rotational speed that the resist solution discharged to the vicinity of the center of the rotating wafer W does not spin off at once but spreads over the surface of the wafer W uniformly. In a case where the diameter of the wafer W is 200 mm, it is preferable to set the first rotational speed $R_1$ to, for example, 3000 to 6000 rpm. In a case where the diameter of the wafer W is 300 mm, it is preferable to set the first rotational speed $R_1$ to 2000 to 4000 rpm.

The second rotational speed $R_2$ is set to the rotational speed at which the deceleration from the first rotational speed $R_1$ does not cause the returning of the resist solution toward the center of the wafer W to appear noticeably and the drying of the resist film on the wafer W is suppressed to a certain level. From such a viewpoint, it is preferable that the second rotational speed $R_2$ should be set to or less than 2000 rpm, for example, 500 to 2000 rpm.

As mentioned above, the purpose of holding the third rotational speed $R_3$ over the time $T_5$ is to adjust the film thickness of the coated resist solution prior to drying by rotating the wafer W, with appropriate centrifugal force applied thereto, at a rotational speed low enough not to dry the resist solution on the wafer W (i.e., low enough not to lose the fluidity). Therefore, if the third rotational speed $R_3$ is too high, the resist solution becomes dry and loses the fluidity, so that the film thickness adjustment function does not work well. From such a viewpoint, it is preferable that the third rotational speed $R_3$ should be set to or less than 500 rpm, for example, 100 to 500 rpm.

As mentioned above, the third rotational speed $R_3$ may be set in a rotational halt state ($R_3$=0 rpm) In that case, the thickness of the resist film can be adjusted by controlling the airflow of clean air to be supplied through the high-efficiency dust collection filter 41 located above the wafer W to the resist coating unit (COT) 1 or the airflow of a gas containing a solvent for the resist solution be supplied to the resist coating unit (COT) 1.

The fourth rotational speed $R_4$ is set in such a way as to provide centrifugal force sufficient to spin off the excess resist solution on the surface of the wafer W from the periphery of the wafer W. From this viewpoint, when the diameter of the wafer W is 200 mm, it is preferable to set the fourth rotational speed $R_4$ to, for example, 1500 to 4000 rpm. When the diameter of the wafer W is 300 mm, it is preferable to set the third rotational speed $R_3$ to, for example, 750 to 2000 rpm. The fourth rotational speed $R_4$, which is normally lower than the first rotational speed $R_1$, can be set higher than the first rotational speed $R_1$.

At the first rotational speed $R_1$, drying of the resist film after the discharge of the resist solution progresses rapidly. To effectively carry out the film thickness adjustment at the third rotational speed $R_3$, therefore, it is necessary to promptly shift the rotational speed to the second rotational speed $R_2$ after the discharge of the resist solution is completed. Therefore, it is preferable that the deceleration A1 in the deceleration step from the first rotational speed $R_1$ to the second rotational speed $R_2$ should be set to or less than 20000 rpm/sec, e.g., 20000 to 50000 rpm/sec, and the deceleration time $T_2$ should be set to or less than 0.2 sec.

The sustain time $T_3$ of the second rotational speed $R_2$ needs to be long enough to suppress the returning of the resist solution to the center of the wafer W at the time of transition to the third rotational speed $R_3$. The second rotational speed $R_2$ should however be suppressed within a predetermine time so that the resist film is not dried before transition to the third rotational speed $R_3$. From those viewpoints, the sustain time $T_3$ of the second rotational speed $R_2$ should preferably be set equal to or less than 0.5 sec, and should desirably be set to 0.2 to 0.5 sec.

It is preferable that the deceleration A2 in the deceleration step from the second rotational speed $R_2$ to the third rotational speed $R_3$ should be set to, for example, 5000 to 50000 rpm/sec, and the time $T_4$ should be set less than or equal to 0.5 sec.

The sustain time $T_5$ of the third rotational speed $R_3$ is set to such a time that the resist solution, which is discharged onto the surface of the wafer W and slowly spreads radially outward toward the circumference of the wafer W to adjust the film thickness at the third rotational speed $R_3$, does not spread over the entire surface of the wafer W nor dry out, and that the throughput is not impaired. Therefore, the sustain time $T_5$ of the third rotational speed $R_3$ should preferably be set to or less than 3 sec, more preferably, to 1 to 2 sec.

In considering that the steps a to d should be carried out during a period until the resist solution discharged on the wafer W is dried out, it is preferable that the total time of the deceleration time $T_2$ from the first rotational speed $R_1$ to the second rotational speed $R_2$, the time $T_3$ for keeping the second rotational speed $R_2$, and the deceleration time $T_4$ from the second rotational speed $R_2$ to the third rotational speed $R_3$ should be set to or less than 1.5 sec.

As explained above, it is possible to do film thickness adjustment with a high degree of freedom by controlling an application condition with the first rotational speed $R_1$, the second rotational speed $R_2$, the third rotational speed $R_3$, the times $T_2$ to $T_5$, the decelerations A1 and A2 taken as parameters.

The film thickness can be also adjusted by changing the acceleration A3 in increasing the rotational speed from the third rotational speed $R_3$ to the fourth rotational speed $R_4$. That is, the resist solution is not dried out yet after the rotation at the third rotational speed $R_3$ is terminated, so that changing the A3 changes the film thickness. Specifically, the smaller the A3 is set, the thicker the film thickness at the periphery of the wafer W becomes. Therefore, it is possible to adjust the film thickness with a higher degree of freedom by controlling the film thickness with the acceleration A3 taken as a parameter in addition to the aforementioned parameters. The acceleration A3 can be adjusted by an increment in the rotational speed from the third rotational speed $R_3$ to the fourth rotational speed $R_4$ and the time $T_6$.

The timing at which the rotational speed of the wafer W is reduced from the first rotational speed $R_1$ to the second rotational speed $R_2$ is normally set after the discharge of the resist solution is finished. It is however preferable that the timing should be set right after the discharge of the resist solution as shown in FIG. 4. That is, it is preferable that the time $T_1$ of the resist discharge step and should be equal to a resist discharge time $T_1$, and thus it is preferable that the rotational speed should be decelerated almost at the same time as the end of the discharge of the resist solution. If a high rotational speed is kept after the end of the discharge, the drying of the resist solution progresses, so that the function of adjusting the film thickness may not be demonstrated effectively. The drying of the resist solution can be suppressed by decreasing the rotational speed of the wafer W right after the supply of the resist solution is terminated. This further facilitates the adjustment of the film thickness, and prevents the surface of the wafer W from becoming uneven.

It is possible to execute a so-called pre-wet process of wetting the entire surface of the wafer W with a solvent like a thinner prior to the application of the resist solution. This facilitates spreading of the resist solution, resulting in the formation of a resist film with a more uniform thickness with a smaller amount of the resist solution, and further reducing the consumption of the resist solution.

Next, the present invention will be explained in more detail with reference to some examples of the invention and comparative examples.

Figure 6A:
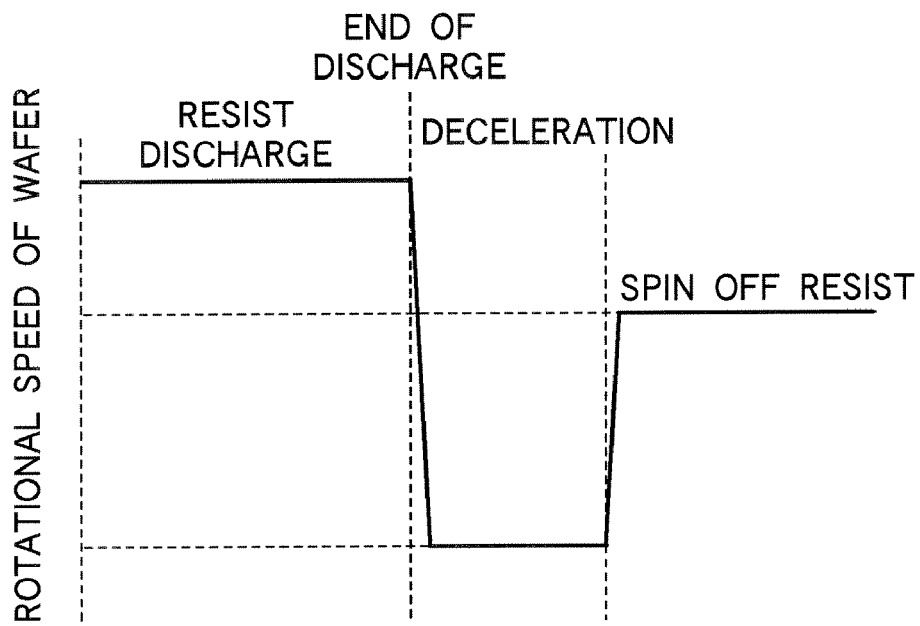
FIG. 6A is an exemplary diagram illustrating the outline of rotational controls after resist coating by comparative methods.
Figure 6B:
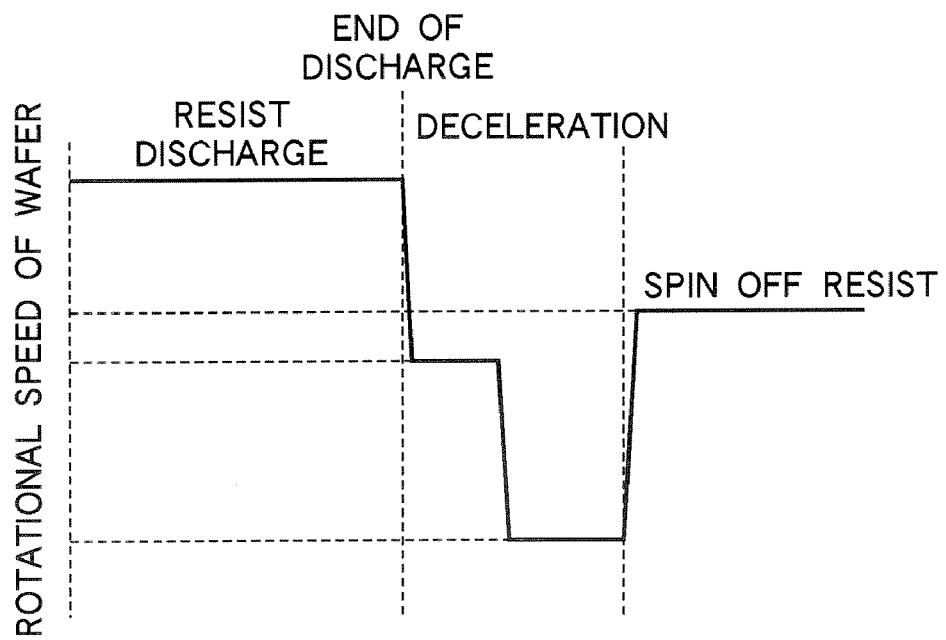
FIG. 6B is an exemplary diagram illustrating the outline of rotational control by a method of the invention.

A comparative method of reducing the rotational speed in one step after the application of the resist solution, and increasing the rotational speed to spin off and dry out the resist solution as shown in FIG. 6A, and a present method of the invention of reducing the rotational speed in two steps after the application of the resist solution, and increasing the rotational speed to spin off and dry out the resist solution as shown in FIG. 6B are compared and reviewed. Note that FIGS. 6A and 6B are exemplary diagrams, and do not accurately illustrate rotational speeds and step times of the examples of the invention and the comparative examples.

First, the pre-wet process of setting a wafer W having a diameter of 200 mm (8 inches) on the spin chuck, supplying a 2.0 ml of thinner onto the wafer W at rest, spreading the thinner at a rotational speed of 1000 rpm for 0.1 sec was carried out. Thereafter, the rotational speed of the wafer was increased to 3000 rpm, 4000 rpm, or 5000 rpm (acceleration of 10000 rpm/sec), and a resist solution (a solution containing an MMP solvent and an i-ray resist; viscosity of 9 cp) was supplied for 1.5 sec in this state.

The amounts of the resist solution supplied were set to 0.4 ml, 0.5 ml, 0.6 ml, 0.7 ml, 0.8 ml, or 0.9 ml as shown in Table 1.

TABLE 1

| Supply amount of resist | | 0.4 ml | 0.5 ml | 0.6 ml | 0.7 ml | 0.8 ml | 0.9 ml |
|---|---|---|---|---|---|---|---|
| Comparative method | 3000 rpm | x | x | x | x | ○ | ○ |
| | 4000 rpm | x | x | x | ○ | ○ | ○ |
| | 5000 rpm | x | x | ○ | ○ | ○ | ○ |
| Present method | 3000 rpm | x | x | x | ○ | ○ | ○ |
| | 4000 rpm | x | x | ○ | ○ | ○ | ○ |
| | 5000 rpm | x | x | ○ | ○ | ○ | ○ |

In Table 1, the comparative method illustrates coating performances in a case where the rotational speed of the wafer was reduced to 100 rpm (deceleration of 50000 rpm/sec) after the resist solution was supplied, kept for 1.5 sec, and increased to 3000 rpm (acceleration of 10000 rpm/sec) after which the resist solution was spun off and dried for 30 sec. The present method of the invention illustrates coating performances in a case where the rotational speed of the wafer was once reduced to 2000 rpm (deceleration of 50000 rpm/sec) after the resist solution was supplied, kept for 0.5 sec, decelerated to 100 rpm (deceleration of 50000 rpm/sec), and increased to 3000 rpm (acceleration of 10000 rpm/sec) after which the resist solution was spun off and dried for 30 sec. The marks "○" in Table 1 indicate that the application performance was good, and the marks "x" in Table 1 indicate that a coated film covering the entire surface of the wafer could not be formed. The numerals "3000 rpm", "4000 rpm", and "5000 rpm" in Table 1 each indicates the number of rotations (first rotational speed) when the resist solution was supplied.

It is apparent from Table 1 that the present method of the invention shows an effect of saving the resist solution by 0.1 ml or so in the categories of 3000 rpm and 4000 rpm in comparison with the comparative method. According to the present method of the invention, when there was a difference of 2000 to 3000 rpm between the first rotational speed $R_1$ and the second rotational speed $R_2$, a greater effect of saving the resist solution was achieved.

Next, the pre-wet process of setting a wafer W having a diameter of 300 mm (12 inches) on the spin chuck, supplying a 3.0 ml of thinner onto the wafer W at rest, spreading the thinner at a rotational speed of 1000 rpm for 0.1 sec was carried out. Thereafter, the rotational speed of the wafer was increased to 3000 rpm (acceleration of 10000 rpm/sec), and a resist solution (a solution containing an EL solvent and a KrF-series resist; viscosity of 6 cp) was supplied for 2 sec in this state.

The amounts of the resist solution supplied were set to 1.0 ml, 1.1 ml, 1.2 ml, 1.3 ml, 1.4 ml, or 1.5 ml as shown in Table 2.

TABLE 2

| Supply amount of resist | 1.0 ml | 1.1 ml | 1.2 ml | 1.3 ml | 1.4 ml | 1.5 ml |
|---|---|---|---|---|---|---|
| Comparative method | x | x | x | o | o | o |
| Present method | x | x | o | o | o | o |

In Table 2, the comparative method illustrates coating performances in a case where the rotational speed of the wafer was reduced to 100 rpm (deceleration of 30000 rpm/sec) after the resist solution was supplied, kept for 1.5 sec, and increased to 1600 rpm (acceleration of 10000 rpm/sec) after which the resist solution was spun off and dried for 35 sec. The present method of the invention illustrates coating performances in a case where the rotational speed of the wafer was once reduced to 2000 rpm (deceleration of 30000 rpm/sec) after the resist solution was supplied, kept for 0.5 sec, decelerated to 100 rpm (deceleration of 30000 rpm/sec), and increased to 1600 rpm (acceleration of 10000 rpm/sec) after which the resist solution was spun off and dried for 35 sec. The marks "O" and "x" in Table 2 indicate the same evaluation contents as those of Table 1.

It is apparent from Table 2 that the comparative method is inferior in saving the resist solution while providing a coated film with a uniform thickness, and has some room for improvement. The invention shows an effect of saving the resist solution by 0.1 ml or so in comparison with the comparative method, and ensures resist coating with a smaller amount of the resist solution to be supplied.

As explained above, according to the preferable embodiments of the invention, in applying the resist solution while rotating the target substrate, as the rotational speed of the target substrate is decreased at least in two steps after supply of the resist film is terminated, the amount of the resist solution to be used can be saved to nearly to the limit while achieving uniform film thickness.

That is, as the rotational speed of the target substrate is temporarily reduced to the second rotational speed $R_2$ in the process of reducing the rotational speed to the third rotational speed $R_3$ or the rotational halt state, for adjusting the thickness of the resist film from the first rotational speed $R_1$, it is possible to suppress the rapid-deceleration oriented action of returning the resist solution toward inside (the center of) the target substrate and avoid consumption of an excess resist solution. The film thickness can be made uniform by adjusting the film thickness at the third rotational speed $R_3$ or in the rotational halt state. Therefore, it is possible to apply the resist solution to a uniform film thickness while the amount of the supply of the resist solution is reduced as much as possible.

The present invention is not limited to the above-described embodiments, and can be modified in various other forms. For example, although the rotational speed is decreased to the second rotational speed $R_2$ right after the supply of the resist solution is terminated in the embodiments, it is not necessary to decrease the rotational speed right after the termination of the supply of the resist solution. As mentioned above, however, deceleration right after the termination of the supply of the resist solution can make the film thickness adjustment work further effectively, leading to a greater reduction in resist solution.

Although the deceleration is executed in two steps, reduction from the first rotational speed $R_1$ to the second rotational speed $R_2$ and reduction from the second rotational speed $R_2$ to the third rotational speed $R_3$ in the embodiment, the number of deceleration steps is not limited to two, but may be set to three or more steps as long as the rapid-deceleration oriented action of returning the resist solution can be suppressed.

In the embodiments, a pre-wet process using a thinner is executed, but the advantageous effect of the invention can be provided even in a case where no pre-wet process is executed.

Further, although the foregoing descriptions of the embodiments have been given of a coating apparatus which applies a resist solution to a semiconductor wafer, the invention can also be applied to a case where the resist solution is applied to other substrates to be processed than a semiconductor wafer, e.g., an LCD substrate.

The above-explained embodiments are intended only to clarify the technical contents of the invention. The invention should not in any way be limited to such specific embodiments, but can be modified in various other forms within the spirit of the invention and the scope of the invention set out in the accompanying claims.

What is claimed is:

1. A resist coating method comprising:
supplying a resist solution to substantially a center of a circular target substrate to be processed while rotating the target substrate at a first rotational speed of 2,000 rpm to 6,000 rpm during a supply period, and terminating supply of the resist solution at an end of the supply period such that the resist solution is kept not supplied onto the target substrate thereafter until residual parts of the resist solution have been spun off;
rotating the target substrate while reducing a rotational speed thereof from the first rotational speed to a second rotational speed that is lower than the first rotational speed and that is 500 to 2,000 rpm with a deceleration rate of 20,000 to 50,000 rpm/sec during a period from a first time point at the end of the supply period, at which supply of the resist solution is terminated, to a second time point;
rotating the target substrate at the second rotational speed during a period of 0.2 to 0.5 seconds from the second time point to a third time point;
rotating the target substrate while reducing a rotational speed thereof from the second rotational speed to a third rotational speed that is lower than the second rotational speed and that is 100 to 500 rpm with a deceleration rate of 5,000 to 50,000 rpm/sec during a period from the third time point to a fourth time point, the periods from the first time point to the fourth time point being less than or equal to 1.5 seconds in total;
rotating the target substrate at the third rotational speed during a period of 1 to 3 seconds from the fourth time point to a fifth time point to adjust a film thickness of the resist solution; and
rotating the target substrate while accelerating a rotational speed thereof from the third rotational speed to a fourth rotational speed higher than the third rotational speed during a period from the fifth time point to a sixth time point, and rotating the target substrate at the fourth rotational speed from the sixth time point to spin off residual parts of the resist solution.

2. The resist coating method according to claim 1, wherein the period from the first time point to the second time point is less than or equal to 0.2 seconds.

3. The resist coating method according to claim 1, wherein the period from the third time point to the fourth time point is less than or equal to 0.5 seconds.

4. The resist coating method according to claim 1, wherein the target substrate is a circular disk having a diameter of 200 mm, and the first rotational speed is 3,000 to 6,000 rpm.

5. The resist coating method according to claim 4, wherein the fourth rotational speed is 1,500 to 4,000 rpm.

6. The resist coating method according to claim 1, wherein the target substrate is a circular disk having a diameter of 300 mm, and the first rotational speed is 2,000 to 4,000 rpm.

7. The resist coating method according to claim 6, wherein the fourth rotational speed is 750 to 2,000 rpm.

8. The resist coating method according to claim 1, further comprising a step of supplying a solvent onto a surface of the target substrate to wet the surface thereof prior to coating of the resist solution.

9. The resist coating method according to claim 1, further comprising a step of controlling an acceleration rate in increasing the rotational speed to the fourth rotational speed from the third rotational speed to adjust a film thickness of the resist solution.

10. The resist coating method according to claim 1, wherein the fourth rotational speed is lower than the first rotational speed.

11. The resist coating method according to claim 1, wherein the fourth rotational speed is higher than the second rotational speed.

12. The resist coating method according to claim 1, wherein the period from the fourth time point to the fifth time point for rotating the target substrate at the third rotational speed is 1 to 2 seconds.

* * * * *